United States Patent
Tien et al.

(10) Patent No.: US 7,511,373 B2
(45) Date of Patent: Mar. 31, 2009

(54) CAP PACKAGE FOR MICRO ELECTRO-MECHANICAL SYSTEM

(75) Inventors: Jiung-Yue Tien, Taichung County (TW); Ming-Te Tu, Taichung County (TW); Chin-Ching Huang, Taichung County (TW)

(73) Assignee: Lingsen Precision Inductries, Ltd., T.E.P.Z. Taichung (TW)

( * ) Notice: Subject to any disclaimer, the term of this patent is extended or adjusted under 35 U.S.C. 154(b) by 89 days.

(21) Appl. No.: 11/766,459

(22) Filed: Jun. 21, 2007

(65) Prior Publication Data
US 2008/0164594 A1 Jul. 10, 2008

(30) Foreign Application Priority Data
Jan. 4, 2007 (TW) .............................. 96200167 U

(51) Int. Cl.
*H01L 23/10* (2006.01)
(52) U.S. Cl. ..................................... 257/710; 257/704
(58) Field of Classification Search ................. 257/710, 257/704
See application file for complete search history.

(56) References Cited

U.S. PATENT DOCUMENTS

| 6,323,550 | B1 * | 11/2001 | Martin et al. | ............... 257/704 |
| 6,583,040 | B1 * | 6/2003 | Lin | ............................ 438/612 |
| 6,984,896 | B2 * | 1/2006 | Wu | ............................ 257/784 |

* cited by examiner

*Primary Examiner*—Douglas M Menz
(74) *Attorney, Agent, or Firm*—Browdy and Neimark, P.L.L.C.

(57) ABSTRACT

A cap package for MEMS includes a substrate having a connection zone that is grounded, a chip mounted on the substrate, a cap capped on the substrate and provided with a through hole corresponding to the chip, and a conducting glue made of a non-metal material having a resistivity smaller than $10^2$ Ωm. The conducting glue is applied on the connection zone of the substrate and sandwiched between the cap and the substrate for electrically connecting the cap with the substrate.

4 Claims, 1 Drawing Sheet

CAP PACKAGE FOR MICRO ELECTRO-MECHANICAL SYSTEM

BACKGROUND OF THE INVENTION

1. Field of the Invention

The present invention relates generally to cap packages and more particularly, to a cap package for micro electro-mechanical system (hereinafter referred to as "MEMS").

2. Description of the Related Art

In the manufacturing process of a cap package for MEMS, a conducting glue will be used. The conducting glue for this purpose is conventionally prepared by filling a metal conducting material, such as gold powder, platinum powder, silver powder, nickel powder, copper powder, aluminum powder, or silver-coated grains, in a resin material to provide the characteristic of conductivity.

In the packaging process of the cap package, the prepared conducting glue is applied on the surface of the substrate for mounting a cap on the substrate. The conductivity of the conducting glue fits a predetermined circuit line to provide, subject to the user's requirements, a specific effect, for example, forming decoupling capacitor for isolating alternating current (AC) noise or radio frequency noises, and/or forming a grounded connection between the cap and substrate for minimizing the electro-magnetic interference (hereinafter referred to as "EMI"). However, because conventional conducting glues commonly use precious metals, such as gold powder, platinum powder, silver powder, etc., the cost is high. Therefore, conventional cap packages have the common drawback of high manufacturing cost.

Therefore, it is desirable to provide a cap package that can eliminate the aforesaid drawbacks.

SUMMARY OF THE INVENTION

The present invention has been accomplished under the circumstances in view. It is therefore one objective of the present invention to provide a cap package for MEMS with lower manufacturing cost.

To achieve this objective of the present invention, the invention provides a cap package, which comprises a substrate, a chip, a cap and a conducting glue. The substrate has a connection zone that is grounded. The chip is mounted on the substrate. The cap is capped on the substrate and provided with a through hole corresponding to the chip. The conducting glue is made of a non-metal material having a resistivity smaller than $10^2$ $\Omega M$ (ohm-meter). The conducting glue is applied on the connection zone of the substrate and sandwiched between the cap and the substrate. The non-metal material can be carbon-doped epoxy or conducting polymers.

Compared with the conventional precious metal-contained conducting glue, the conducting glue provided by the present invention is made of non-metal materials, which is lower in cost than the precious metal, thereby lowering the manufacturing cost of the cap package.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
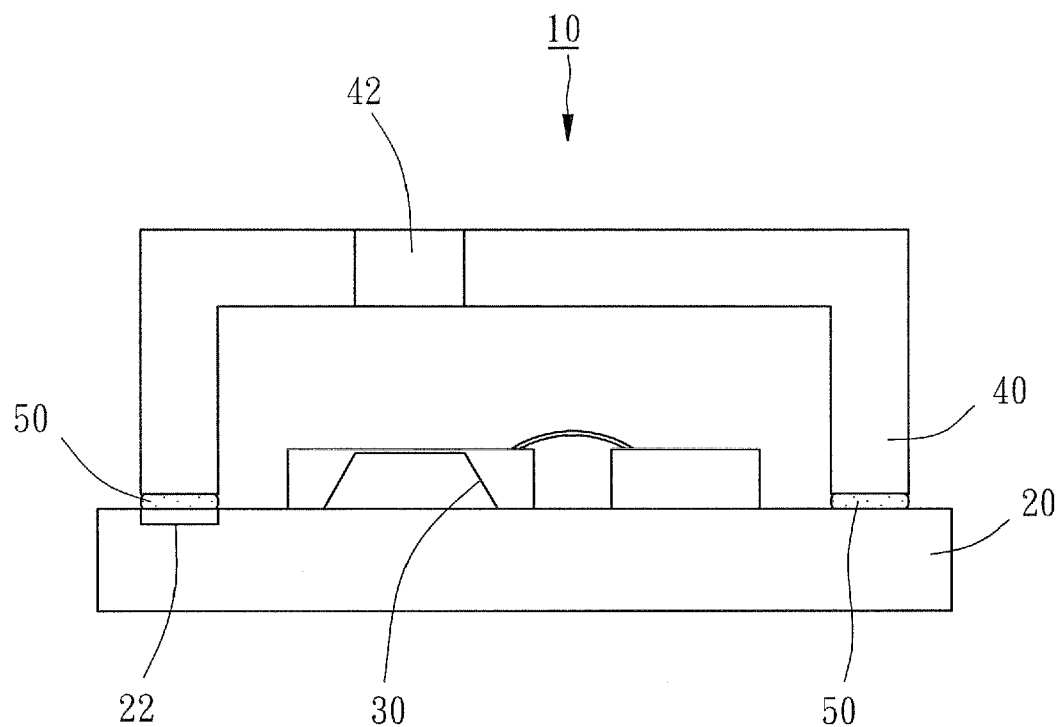
FIG. 1 is a schematic drawing showing a cap package for MEMS in accordance with a preferred embodiment of the present invention.
Figure 2:
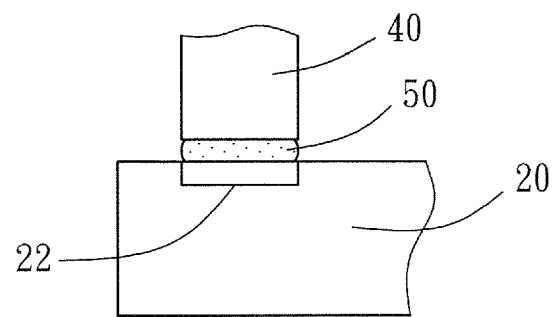
FIG. 2 is an enlarged view of a part of FIG. 1, showing the location of the conducting glue.

As shown in FIGS. 1 and 2, a cap package 10 for MEMS in accordance with a preferred embodiment of the present invention comprises a substrate 20, a chip 30, a cap 40 and a conducting glue 50.

The substrate 20 has a connection zone 22 which is electrically grounded and applied with the conducting glue 50 thereon.

The chip 30 is installed on the substrate 20 and electrically connected with the substrate 20.

The cap 40 is made of a metal material and capped on the substrate 20, having a through hole 42 corresponding to the chip 30.

The conducting glue 50 is prepared from a non-metal conducting material, for example, carbon-doped epoxy or conducting polymers with matrix selected from a group consisting of polyacetylene, polypyrrole (PPy), polythiophene (PT), polyaniline (PANi), poly(p-phenylene) (PPP), and poly(phenylene vinylene) (PPV). According to the present preferred embodiment, the conducting glue 50 is preferably prepared from carbon-doped epoxy, having a resistivity lower than $10^2$ $\Omega m$ (ohm-meter).

By means of the characteristic of epoxy, the cap 40 is firmly bonded to the substrate 20. Further, the conducting characteristic of carbon allows for electrical connection of the substrate 20 to the cap 40 to have the cap 40 be grounded, so that the cap 40 can isolate external electro-magnetic interference (EMI).

As stated above, the invention uses a non-metal material to make the conducting glue to substitute for a precious metal-contained conducting glue, achieving the same effect of a precious metal-contained conducting glue used in the prior art design and lowering the manufacturing cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A cap package for micro electro-mechanical system, comprising:

a substrate having a connection zone that is grounded;

a chip mounted on the substrate;

a cap capped on the substrate and provided with a through hole corresponding to the chip; and a conducting glue made of a non-metal material having a resistivity smaller than $10^2$ Ωm, the conducting glue being applied on the connection zone of the substrate and sandwiched between the cap and the substrate.

2. The cap package as claimed in claim 1, wherein the non-metal material is carbon-doped epoxy.

3. The cap package as claimed in claim 1, wherein the non-metal material is a conducting polymer having matrix selected from the group consisting of polyacetylene, polypyrrole, polythiophene, polyaniline, poly(p-phenylene) and poly(phenylene vinylene).

4. The cap package as claimed in claim 1, wherein the cap is made of metal.

* * * * *